(12) United States Patent
Hsieh et al.

(10) Patent No.: US 11,418,223 B2
(45) Date of Patent: Aug. 16, 2022

(54) DUAL-BAND TRANSFORMER STRUCTURE

(71) Applicant: Realtek Semiconductor Corporation, Hsinchu (TW)

(72) Inventors: Tzu-Hao Hsieh, Taoyuan (TW); Chih-Chieh Wang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 154 days.

(21) Appl. No.: 16/874,858

(22) Filed: May 15, 2020

(65) Prior Publication Data

US 2021/0050871 A1 Feb. 18, 2021

(30) Foreign Application Priority Data

Aug. 14, 2019 (TW) ................................ 108128988

(51) Int. Cl.
*H04B 1/00* (2006.01)
*H03H 7/46* (2006.01)

(52) U.S. Cl.
CPC .......... *H04B 1/0057* (2013.01); *H03H 7/468* (2013.01)

(58) Field of Classification Search
CPC .............................. H04B 1/0057; H03H 7/468
USPC ........................................................... 333/1
See application file for complete search history.

(56) References Cited

U.S. PATENT DOCUMENTS

| 4,882,553 A | 11/1989 | Davies et al. |
| 8,022,887 B1 | 9/2011 | Zarnaghi |
| 2005/0237260 A1* | 10/2005 | Bancroft ............. H01Q 21/205 343/859 |

OTHER PUBLICATIONS

H. Zhang et al., "A Dual-Band Dipole Antenna With Integrated-Balun," IEEE Transactions on Antennas and Propagation, 2009, vol. 57, No. 3, pp. 786-789.
Yongxi Qian et al., A broadband uniplanar microstrip-to-CPS transition—IEEE Conference Publication, Proceedings of 1997 Asia-Pacific Microwave Conference, 1997.
Andres Li Shen et al., Dual-band balun with flexible frequency ratios, Electronics Letters, 2014, vol. 50, No. 17, pp. 1213-1214.

* cited by examiner

*Primary Examiner* — Stephen E. Jones
*Assistant Examiner* — Kimberly E Glenn
(74) *Attorney, Agent, or Firm* — Locke Lord LLP; Tim Tingkang Xia, Esq.

(57) ABSTRACT

The present disclosure provides a dual-band transformer structure, which is suitable for at least two frequencies. The dual-band transformer structure includes a metal layer, a first transmission line, a second transmission line, and a third transmission line. The first transmission line and the second transmission line are disposed on the metal layer. A first end of the second transmission line is coupled to a second end of the first transmission line. A second end of the second transmission line is aligned with an edge of the metal layer, and a first end of the third transmission line is coupled to the second end of the second transmission line. The third transmission line extends away from the edge.

20 Claims, 6 Drawing Sheets

DUAL-BAND TRANSFORMER STRUCTURE

CROSS-REFERENCE TO RELATED APPLICATION

This application claims priority to Taiwan Application Serial Number 108128988, filed Aug. 14, 2019, which is herein incorporated by reference in its entirety.

BACKGROUND

Technical Field

The present disclosure relates to a circuit structure, and more particularly, to a dual-band transformer structure.

Description of Related Art

In the field of wireless communication, the use of a dual-band or multi-band configuration is usually required in the system to lower component requirements and reduce circuit size. In circuit design, a balance-unbalance (balun) transformer is often used as a signal transformation component between balance and unbalance. Therefore, an issue of concern in this technical field relates to how to implement a circuit design that can be applied to both dual-band and balun transformers.

SUMMARY

The present disclosure of an embodiment provides a dual-band transformer structure, which is suitable for at least two frequencies. The dual-band transformer structure includes a metal layer, a first transmission line, a second transmission line, and a third transmission line. The first transmission line and the second transmission line are disposed on the metal layer, in which a first end of the second transmission line is coupled to a first end of the first transmission line, and a second end of the second transmission line is aligned with an edge of the metal layer. A first end of the third transmission line is coupled to the second end of the second transmission line, in which the third transmission line extends away from the edge.

BRIEF DESCRIPTION OF THE DRAWINGS

The disclosure can be more fully understood by reading the following detailed description of the embodiments, with reference made to the accompanying drawings as described below. It should be noted that the features in the drawings are not necessarily to scale. In fact, the dimensions of the features may be arbitrarily increased or decreased for clarity of discussion.

DETAILED DESCRIPTION

Figure 1:
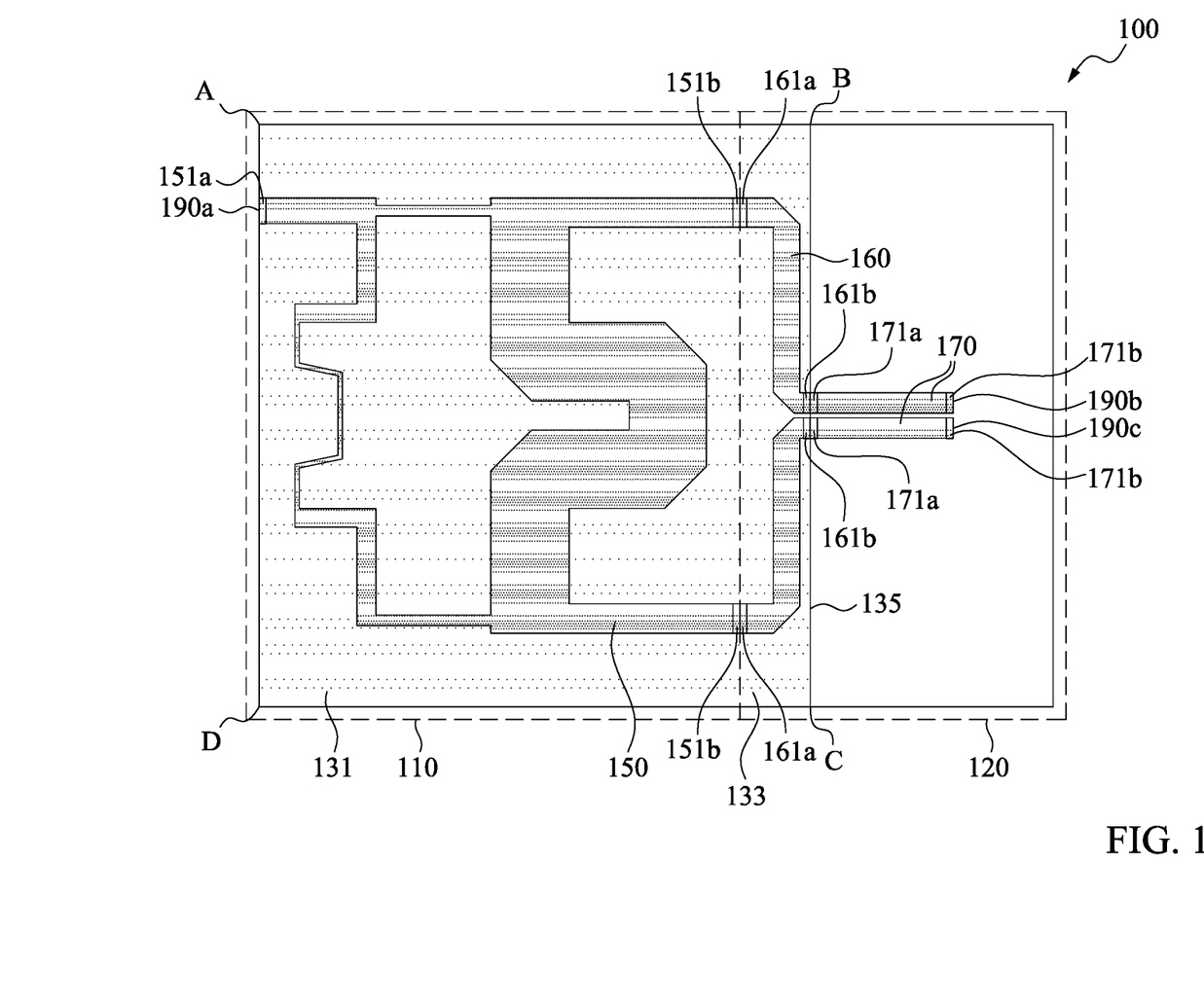
FIG. 1 is a schematic diagram of a dual-band transformer structure according to some embodiments of the present disclosure.

Reference is made to FIG. 1. FIG. 1 is a schematic diagram of a dual-band transformer structure 100 according to some embodiments of the present disclosure. As shown in FIG. 1, the dual-band transformer structure 100 includes a first circuit 110 and a second circuit 120. The first circuit 110 includes a metal layer 131 and a transmission line 150. The transmission line 150 is disposed on the metal layer 131. One end 151a of the transmission line 150 includes a port 190a, so that the first circuit 110 is connected to a test device (not shown) through the port 190a.

The second circuit 120 includes a metal layer 133, transmission lines 160, and transmission lines 170. The transmission lines 160 are disposed on the metal layer 133. The metal layer 133 is disposed adjacent to the metal layer 131. In some embodiments, the metal layer 131 and the metal layer 133 may be the same metal layer. Accordingly, the transmission line 150 and the transmission lines 160 are disposed on the same metal layer.

One end 161a of each of the transmission lines 160 is coupled to one of two ends 151b of the transmission line 150. One end 161b of each of the transmission lines 160 is aligned with an edge 135 of the metal layer 133. In some embodiments, elements within a region surrounded by an end point A, an end point B, an end point C, and an end point D shown in FIG. 1 (i.e., the metal layer 131, the metal layer 133, the transmission line 150, and the transmission lines 160) form a balance-unbalance (balun) transformer.

In some embodiments, the transmission lines 170 are not disposed on the metal layer 133. One end 171a of each of the transmission lines 170 is coupled to the one end 161b of one of the transmission lines 160, and the transmission lines 170 are configured to extend away from the edge 135 of the metal layer 133. Two ends 171b of the transmission lines 170 away from the edge 135 include a port 190b and a port 190c, respectively. The second circuit 120 may be connected to an integrated circuit chip (not shown) or an antenna (not shown) through the port 190b and the port 190c. In some embodiments, the plane where the transmission lines 170 are located is parallel to the planes of the metal layer 131 and the metal layer 133.

As shown in FIG. 1, in some embodiments, the transmission line 150 and the transmission lines 160 are a dual-band microstrip structure, and the transmission lines 170 are a coplanar strip structure. The metal layer 133 under the transmission lines 160 (microstrip) can be used as a ground layer, and there is no metal layer that can be used as a ground layer disposed under the transmission lines 170 (coplanar strip). As a result, the port 190a of the first circuit 110 is fed with a microwave signal, so that the microwave signal is subjected to balanced and unbalanced output transformation on the microstrip, and then outputted through the port 190b and the port 190c of the coplanar strip, in order to achieve single-ended input and double-ended output signal transformation, or double-ended input and single-ended output signal transformation.

Figure 2:
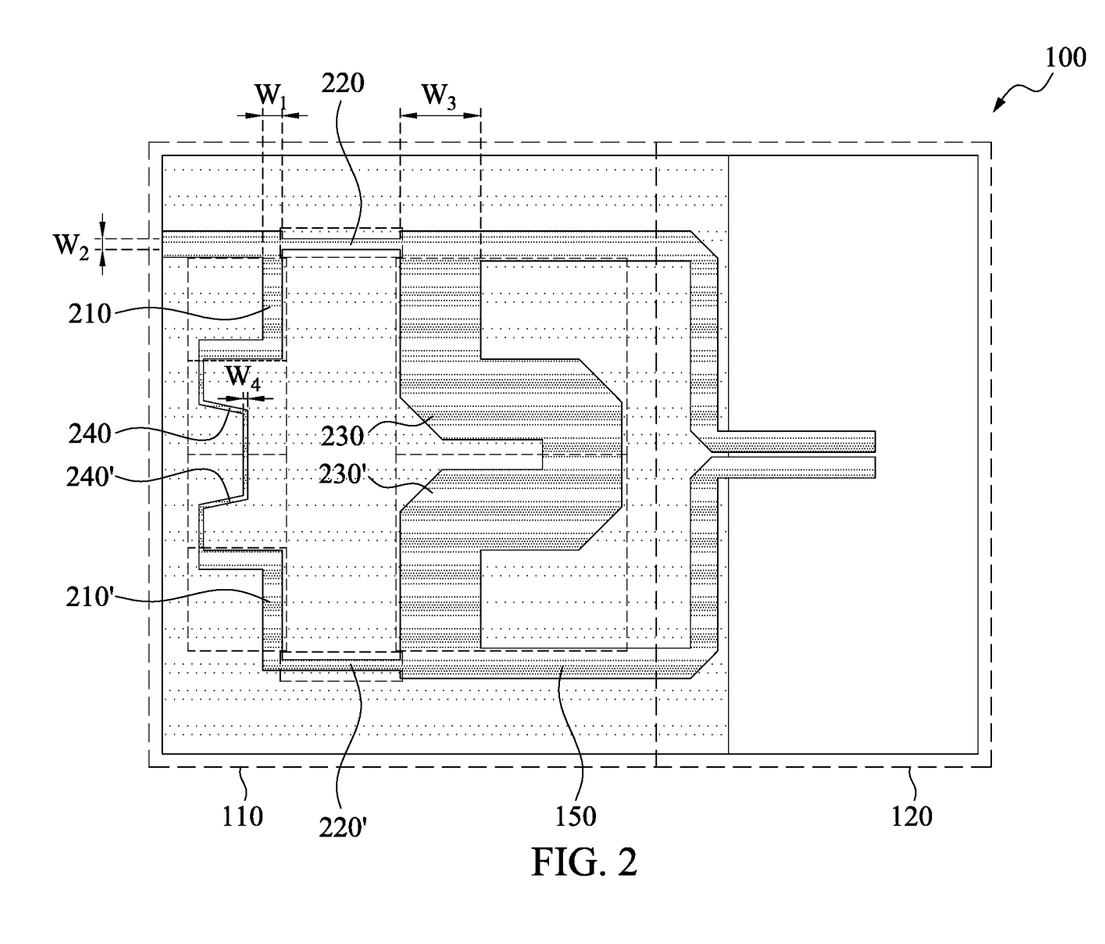
FIG. 2 is a schematic diagram of a plurality of segments of the dual-band transformer structure according to some embodiments of the present disclosure.

Reference is made to FIG. 2. FIG. 2 is a schematic diagram of a plurality of segments of the dual-band transformer structure 100 according to some embodiments of the present disclosure. As shown in FIG. 2, the transmission line 150 includes a plurality of segments, and each segment includes an impedance, a width, and a length. In some embodiments, the segments include a segment 210, a segment 220, a segment 230, and a segment 240. The segment 210 has a width $W_1$ and an impedance $z_1$. The segment 220 has a width $W_2$ and an impedance $z_2$. The segment 230 has a width $W_3$ and an impedance $z_3$. The segment 240 has a width $W_4$ and an impedance $z_4$.

Figure 3:
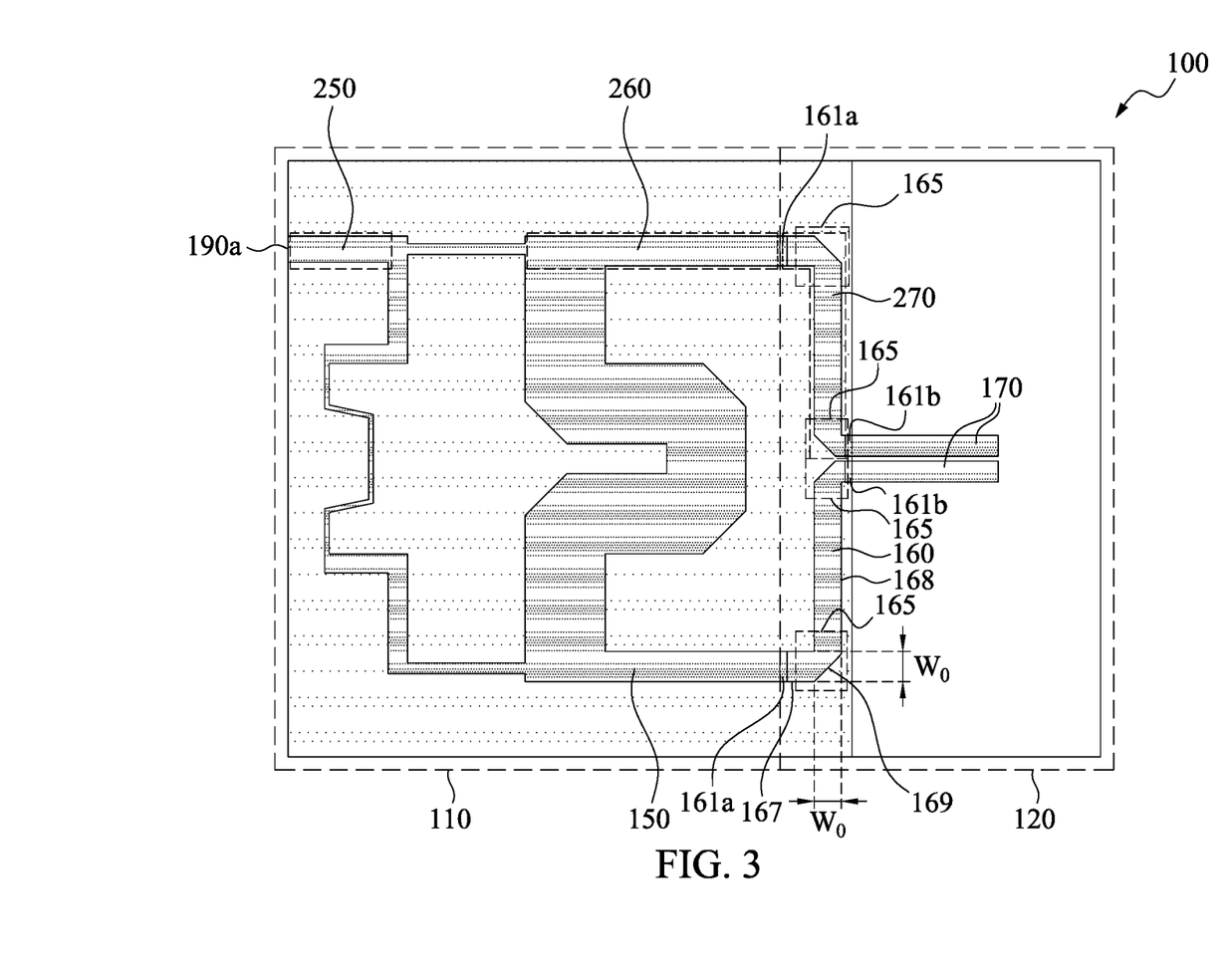
FIG. 3 is a schematic diagram of a plurality of segments of the dual-band transformer structure according to other embodiments of the present disclosure.

Reference is made to FIG. 3. FIG. 3 is a schematic diagram of a plurality of segments of the dual-band transformer structure 100 according to other embodiments of the present disclosure. As shown in FIG. 3, the transmission line 150 includes a segment 250 and a segment 260. The segment 250 and the segment 260 have a width $W_0$ and an impedance $z_0$. At least one of the transmission lines 160 includes a segment 270. The segment 270 has a width $W_0$ and an impedance $z_0$. In one embodiment, the impedances of the segments 250, 260, and 270 are preset impedances. In one embodiment, the preset impedances are nominal characteristic impedances (500).

There is at least one bent portion 165 between two ends (e.g., the end 161a and the end 161b) of the at least one of the transmission lines 160. In one embodiment, the transmission lines 160 include four bent portions 165. After the input signal is received at the port 190a, the input signal is transmitted to the transmission lines 170 through the bent portions 165 of the transmission lines 160. Each of the bent portions 165 includes a truncation, so that the area of the bent portion 165 is reduced. In another embodiment, as shown in FIG. 3, the segment 270 has the width $W_0$, and extension lines of side edges 167 and 168 of the transmission line 160 are separately perpendicular to the bent portion 165. The angles formed by an edge 169 of at least one of the bent portions 165 and the corresponding side edge 167 and the side edge 168 are each 45 degrees (i.e., an isosceles triangle with a side length $W_0$ and two angles of 45 degrees being formed in the bent portion 165). In this way, the impedance discontinuity of the transmission lines 160 can be reduced. In other embodiments, at least one of the bent portions 165 has a quarter arc with a radius $W_0$, or other cutting shapes.

The electrical lengths of these segments (i.e., the microstrip) in FIG. 2 and FIG. 3 are related to the input signal frequency. In the circuit layout and structure of the dual-band transformer structure 100, the impedance of each segment of the microstrip can be adjusted relative to each other, so that the target impedance matching can be implemented at both frequencies (e.g., 2.4 GHz and 5.5 GHz) to achieve the effect of signal transmission.

Figure 4:
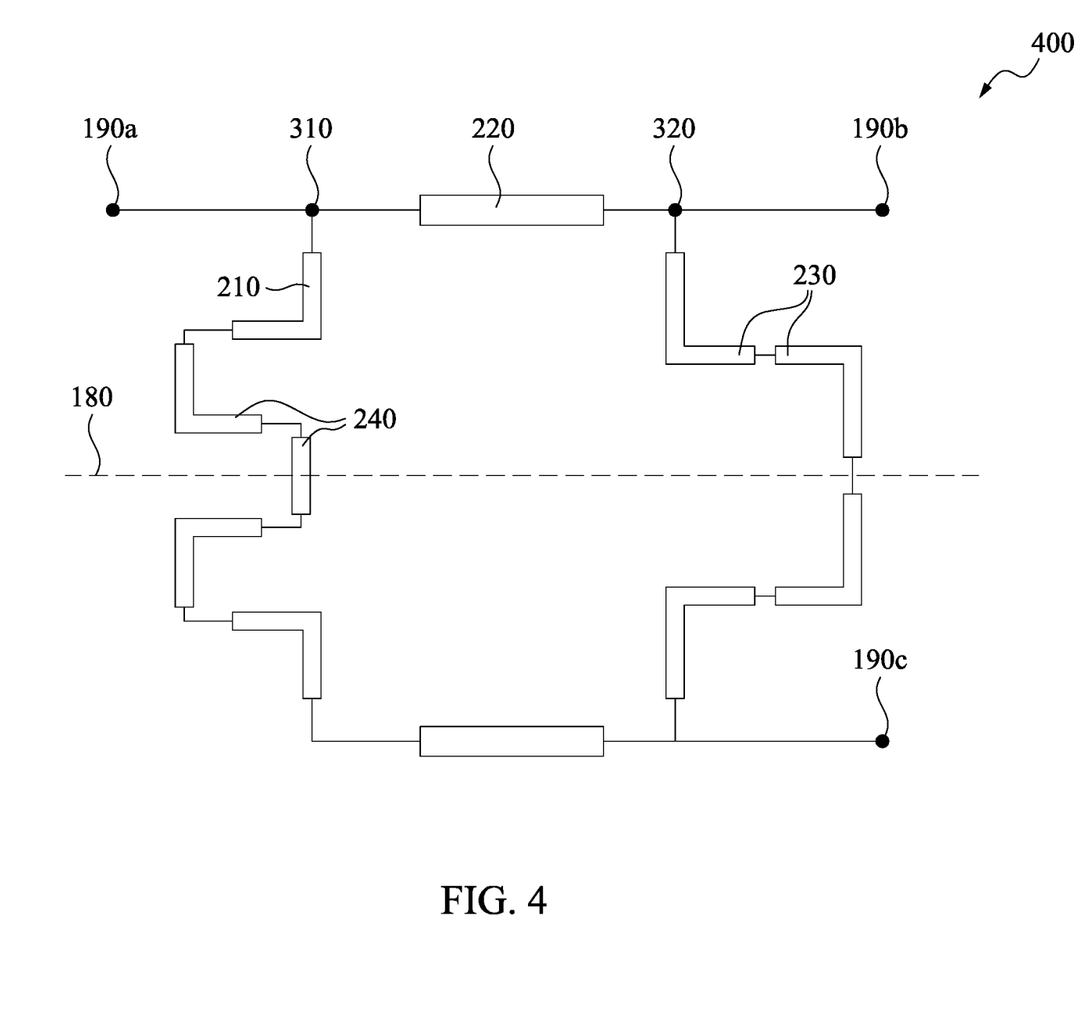
FIG. 4 is a schematic diagram of a dual-band transformer structure according to some embodiments of the present disclosure.

Reference is made to FIG. 4. FIG. 4 is a schematic diagram of a dual-band transformer structure 400 according to some embodiments of the present disclosure. The dual-band transformer structure 400 is analogous to the dual-band transformer structure 100 in FIG. 1 to FIG. 3, and has the same operation and function. FIG. 4 only shows the segments that can be adjusted relative to each other, such as the segment 210, the segment 220, the segment 230, and the segment 240. The thin line represents a segment having a preset impedance (e.g., the segment 250, the segment 260, and the segment 270 in FIG. 3). It is worth mentioning that the dual-band transformer structure 400 of the present disclosure and the dual-band transformer structure 100 in FIG. 1 are symmetrical structures. For example, the segment 210, the segment 220, the segment 230, and the segment 240 form a half-circuit structure (such as the half-circuit structure 115 in FIG. 5). This half-circuit structure is symmetrical to the another half-circuit structure (for example, the segment 210', the segment 220', the segment 230', and the segment 240') based on a symmetry axis 180. As shown in FIG. 4, the dual-band transformer structure 400 has the symmetry axis 180 extending in one direction (for example, a horizontal direction parallel to the segment 220). On the mirror side of the symmetry axis 180 are the segment 210' symmetrical to the segment 210, the segment 220' symmetrical to the segment 220, the segment 230' symmetrical to the segment 230, and the segment 240' symmetrical to the segment 240. In other words, the whole structure of the transmission line 150 of the dual-band transformer structure 100 in FIG. 1 is a substantially symmetrical structure. In the following, a description is provided with respect to the half-circuit structure 115, and those skilled in the art can infer or analogize the content of the other half-circuit structure according to the half-circuit structure 115.

As shown in FIG. 4, one end of the segment 210 and one end of the segment 220 are coupled to the port 190a through a node 310. One end of the segment 230 and the other end of the segment 220 are coupled to the port 190b through a node 320. One end of the segment 240 is coupled to the other end of the segment 210.

Figure 5:
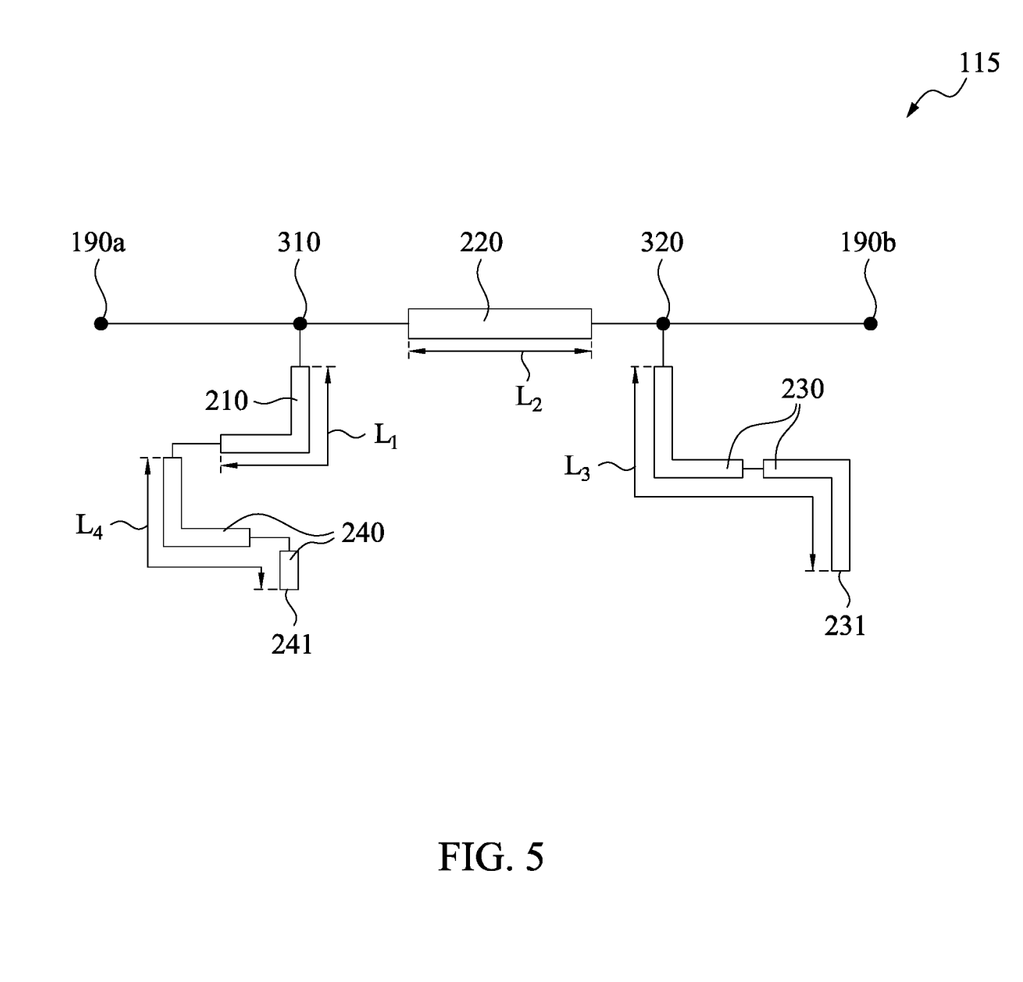
FIG. 5 is a schematic diagram of a half-circuit structure on which an even-mode analysis is performed according to some embodiments of the present disclosure.
Figure 6:
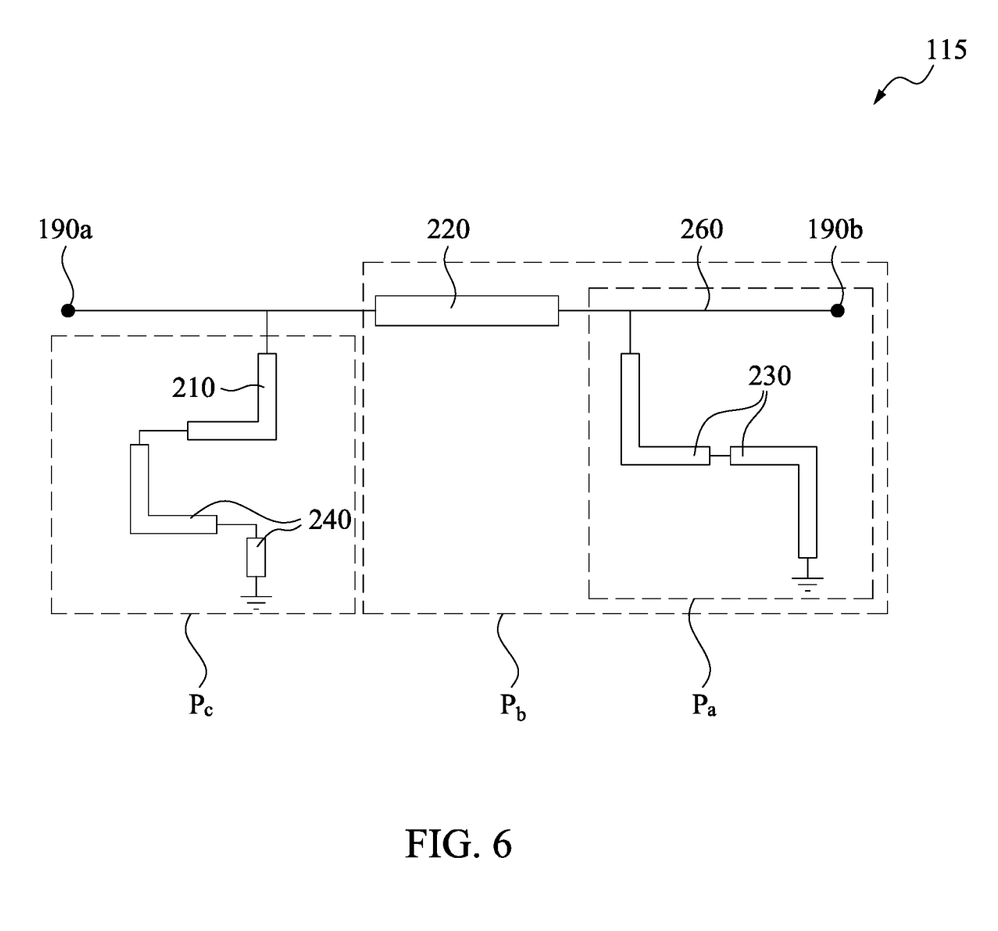
FIG. 6 is a schematic diagram of a half-circuit structure on which an odd-mode analysis is performed according to some embodiments of the present disclosure.

To illustrate that the impedance of each segment of the microstrip can be adjusted relative to each other, reference is made to FIG. 5 and FIG. 6.

FIG. 5 is a schematic diagram of the half-circuit structure 115 on which an even-mode analysis is performed according to some embodiments of the present disclosure. As shown in FIG. 5, an electrical length $L_1$ of the segment 210 is $\theta_1/2$. An electrical length $L_2$ of the segment 220 is $\theta_2$. An electrical length $L_3$ of the segment 230 is $\theta_3$. An electrical length $L_4$ of the segment 240 is $\theta_1/2$. $\theta_1$, $\theta_2$, $\theta_3$ are values related to two different frequencies $f_1$ and $f_2$ (e.g., 2.4 GHz and 5.5 GHz). For example, $\theta_1$, $\theta_2$, $\theta_3$ simultaneously satisfy the following relationships:

$$\theta_1 = \frac{2\pi f_1}{f_1 + f_2}, \quad \text{formula (0)}$$

when the carrier frequency is $f_1$;

$$\theta_1 = \frac{2\pi f_2}{f_1 + f_2},$$

when the carrier frequency is $f_2$;

$$\theta_2 = \frac{\pi f_1}{f_1 + f_2},$$

when the carrier frequency is $f_1$;

$$\theta_2 = \frac{\pi f_2}{f_1 + f_2},$$

when the carrier frequency is $f_3$;

$$\theta_3 = \frac{2\pi f_1}{f_1 + f_2},$$

when the carrier frequency is $f_1$;

$$\theta_3 = \frac{2\pi f_3}{f_1 + f_2},$$

when the carrier frequency is $f_2$;

In the even-mode analysis, the node 310 is viewed as a "short" for the to-be-designed $f_1$ and $f_2$ signals, so that the even-mode signals of the designed $f_1$ and $f_2$ signals at the port 190a cannot reach the port 190b during the even mode. At the same time, an end point 241 of the segment 240 at the symmetry axis 80 (see FIG. 4) is regarded as an "open." Incidentally, an end point 231 of the segment 230 at the symmetry axis 180 (see FIG. 4) is also regarded as an "open." Therefore, the input impedance $Z_{in\_even}$ of the port 190a can be obtained via the even-mode analysis, as shown in formula (1).

$$Z_{in\_even} = Z_1 \frac{-jz_4 \cot \frac{\theta_1}{2} + jz_1 \tan \frac{\theta_1}{2}}{z_1 + \left(z_4 \cot \frac{\theta_1}{2} \tan \frac{\theta_1}{2}\right)} \qquad \text{formula (1)}$$

In formula (1), j is an imaginary number. Since the node 310 is viewed as a "short," the value of $Z_{in\_even}$ is zero. When the value of $Z_{in\_even}$ is zero, the relationship between the impedance $z_1$ of the segment 210 and the impedance $z_4$ of the segment 240 can be obtained, as shown in formula (2).

$$z_4 = z_1 \tan^2\left(\frac{\theta_1}{2}\right) \qquad \text{formula (2)}$$

Reference is made to FIG. 6. FIG. 6 is a schematic diagram of the half-circuit structure 115 on which an odd-mode analysis is performed according to some embodiments of the present disclosure. As shown in FIG. 6, the half-circuit structure 115 includes a circuit portion $P_b$ and a circuit portion $P_c$, in which the circuit portion $P_b$ includes a circuit portion $P_a$. The circuit portion $P_a$ includes the segment 230 and the segment 260. The circuit portion $P_b$ includes the segment 220 and the segment 230. The circuit portion $P_c$ includes the segment 210 and the segment 240.

In the odd-mode analysis, one end of the segment 240 at the symmetry axis 180 (see FIG. 4) is regarded as a "virtual short." Incidentally, one end of the segment 230 at the symmetry axis 180 (see FIG. 4) is also regarded as a "virtual short".

In the odd-mode analysis, the circuit impedance $z_a$ of the circuit portion $P_a$ is related to the impedance $z_3$, the electrical length $L_3$, and the preset impedance $z_0$ of the segment 230, as shown in formula (3).

$$z_a = \frac{jz_0 z_3 \tan\theta_3}{z_0 + jz_3 \tan\theta_3} \qquad \text{formula (3)}$$

The impedance $z_b$ of the circuit portion $P_b$ is related to the circuit impedance $z_a$ of the circuit portion $P_a$, the impedance $z_2$ of the segment 220, and the electrical length $L_2$, as shown in formula (4).

$$z_b = z_2 \cdot \frac{z_a + jz_2 \tan\theta_2}{z_2 + jz_a \tan\theta_2} \qquad \text{formula (4)}$$

The circuit impedance $z_b$ can be obtained by substituting $z_a$, which is calculated by formula (3), into formula (4).

The impedance $z_c$ of the circuit portion $P_c$ is related to the impedance $z_1$ of the segment 210, the impedance $z_4$ of the segment 240, and the electrical length $L_1$ (e.g., $\theta_1/2$) of the segment 210, as shown in formula (5). In one embodiment, the electrical length $L_1$ of the segment 210 is equal to the electrical length $L_4$ of the segment 240.

$$z_c = z_1 \cdot \frac{jz_4 \tan\left(\frac{\theta_1}{2}\right) + jz_1 \tan\left(\frac{\theta_1}{2}\right)}{z_1 + j\left(jz_4 \tan\left(\frac{\theta_1}{2}\right)\right)\tan\left(\frac{\theta_1}{2}\right)} \qquad \text{formula (5)}$$

It is worth mentioning that the circuit impedance $z_c$ contains two variables. Therefore, the relationship between the impedances $z_1$ and $z_c$ can be obtained by substituting formula (2) of the even-mode analysis into formula (5).

In other words, in the present disclosure, the impedance matching can be achieved by adjusting the impedances $z_1$, $z_2$, $z_3$, and $z_4$ in formulas (2) to (5).

As shown in FIG. 6, the circuit portion $P_c$ is connected to the circuit portion $P_b$ in parallel. Therefore, the circuit portion $P_c$ and the circuit portion $P_b$ form a parallel resistance. Accordingly, the input impedance $Z_{in\_odd}$ of the port 190a can be obtained based on the parallel resistance, as shown in formula (6).

$$Z_{in\_odd} = \frac{z_b \cdot z_c}{z_b + z_c} \qquad \text{formula (6)}$$

The value of $Z_{in\_odd}$ in formula (6) can be obtained according to the circuit impedances $z_b$ and $z_c$ of formulas (3) to (5) (i.e., the impedances $z_1$-$z_4$ of the segments 210-240).

In the odd-mode analysis, when the input impedance of the port 190a is equal to twice the preset impedance, the half-circuit structure 115 can achieve the impedance matching, as shown in formula (7).

$$Z_{in\_odd} = 2z_0 \qquad \text{formula (7)}$$

where $z_0$ is the preset impedance.

In some embodiments, when a circuit design is performed on a computing device (not shown), an electromagnetic simulation may be performed via a related software tool to calculate the impedances $z_1$-$z_4$ satisfying formula (76). For example, when the preset impedance $z_0$ is 50 ohms, the computing device (not shown) performs a series of iterative operations. When the impedances $z_1$-$z_4$ are substituted into formulas (2) to (6) and the input impedance $Z_{in\_odd}$ of formula (7) is determined to be equal to 100 ohms, the values of these impedances $z_1$-$z_4$ are recorded. The impedances $z_1$-$z_4$ and the aforementioned electrical lengths $L_1$-$L_4$ (e.g., formula (0) is calculated according to the frequencies $f_1$ and $f_2$) can be further configured to complete the circuit design of the dual-band transformer structure 100.

As a result, when the values of the impedances $z_1$-$z_4$ are applied to the dual-band transformer structure 100, the port 190b and the port 190c of the dual-band transformer structure 100 can have a phase difference of 180 degrees, and the dual-band signal can be operated in the dual-band transformer structure 100. In addition, the dual-band transformer structure 100 is suitable for signals with at least two frequencies. For example, after the port 190a receives a signal having a frequency of 2.4 GHz or a signal having a frequency of 5.5 GHz, both the ports 190b and 190c can output signals having a phase difference of 180 degrees.

In some embodiments, referring back to FIG. 1, the dual-band transformer structure 100 can be bent to reduce the area of the microstrip on the circuit layout and reduce the size of the overall circuit structure.

In some embodiments, the dual-band transformer structure 100 has both a double-layer structure (e.g., the microstrip of the first circuit 110) and a single-layer structure (e.g., the coplanar strip of the second circuit 120). The double-layer structure enables the test device (not shown) to be directly connected to the first circuit 110 through the port 190*a*. In this way, after the port 190*a* feeds the signal to the microstrip, the signal is output to the ports 190*b* and 190*c* through the coplanar strip to complete the signal transformation, and vice versa.

In summary, the dual-band transformer structure 100 of the present disclosure improves the convenience in use. In addition, when the circuit layout is operated at frequencies of 2.4 GHz and 5.5 GHz, the return loss can be reduced below −10 dB. With respect to the insertion loss, the insertion loss is substantially 1.3 dB when operating at a frequency of 2.4 GHz, and the insertion loss is substantially 2.5 dB when operating at a frequency of 5.5 GHz. Therefore, the dual-band transformer structure 100 of the present disclosure can be operated to transform the signal at two frequencies, so that the same circuit can support two frequencies to reduce the use of circuit components, and the effect of maintaining good impedance matching can also be achieved.

What is claimed is:

1. A dual-band transformer structure suitable for at least two frequencies, wherein the dual-band transformer structure comprises:
   a metal layer;
   a first transmission line disposed on the metal layer;
   a second transmission line disposed on the metal layer, wherein a first end of the second transmission line is coupled to a first end of the first transmission line, and a second end of the second transmission line is aligned with an edge of the metal layer; and
   a third transmission line, wherein a first end of the third transmission line is coupled to the second end of the second transmission line, and the third transmission line extends away from the edge of the metal layer,
   wherein the second transmission line has at least one bent portion between the first and second ends of the second transmission line;
   wherein the at least one bent portion comprises a truncation.

2. The dual-band transformer structure of claim 1, wherein a second end of the first transmission line comprises a first port, and a second end of the third transmission line comprises a second port and a third port, wherein the second end of the third transmission line is away from the edge of the metal layer, the first port is configured to receive an input signal, the second port is configured to output a first output signal, and the third port is configured to output a second output signal.

3. The dual-band transformer structure of claim 2, wherein a phase difference between the first output signal and the second output signal is 180 degrees.

4. The dual-band transformer structure of claim 2, wherein the input signal is transmitted to the third transmission line through the at least one bent portion of the second transmission line.

5. The dual-band transformer structure of claim 1, wherein a plane on which the third transmission line is located is parallel to a plane of the metal layer.

6. The dual-band transformer structure of claim 1, wherein the first transmission line has a symmetry axis extending along a direction, and the whole structure of the first transmission line is symmetrical to the symmetry axis.

7. A dual-band transformer structure suitable for at least two frequencies, wherein the dual-band transformer structure comprises:
   a metal layer;
   a first transmission line disposed on the metal layer;
   a second transmission line disposed on the metal layer, wherein a first end of the second transmission line is coupled to a first end of the first transmission line, and a second end of the second transmission line is aligned with an edge of the metal layer; and
   a third transmission line, wherein a first end of the third transmission line is coupled to the second end of the second transmission line, and the third transmission line extends away from the edge of the metal layer,
   wherein the second transmission line has at least one bent portion between the first and second ends of the second transmission line, and each of an angle formed by an edge of the at least one bent portion and a first side of the second transmission line, and an angle formed by the edge of the at least one bent portion and a second side of the second transmission line is 45 degrees.

8. The dual-band transformer structure of claim 7, wherein the edge of the at least one bent portion is intersected with extension lines of the first side and the second side of the second transmission line.

9. The dual-band transformer structure of claim 7, wherein the first side and the second side of the second transmission line are perpendicular to each other.

10. A dual-band transformer structure suitable for at least two frequencies, wherein the dual-band transformer structure comprises:
    a metal layer;
    a first transmission line disposed on the metal layer;
    a second transmission line disposed on the metal layer, wherein a first end of the second transmission line is coupled to a first end of the first transmission line, and a second end of the second transmission line is aligned with an edge of the metal layer; and
    a third transmission line, wherein a first end of the third transmission line is coupled to the second end of the second transmission line, and the third transmission line extends away from the edge of the metal layer,
    wherein a second end of the first transmission line comprises a first port,
    wherein the first transmission line comprises a first segment and a second segment, and a first end of the first segment and a first end of the second segment are coupled to the first port through a node,
    wherein the first transmission line further comprises a third segment, and a first end of the third segment is coupled to a second end of the second segment.

11. The dual-band transformer structure of claim 10, wherein the first transmission line further comprises a fourth segment, and a first end of the fourth segment is coupled to a second end of the first segment.

12. The dual-band transformer structure of claim 11, wherein the first transmission line further comprises a fifth segment, wherein a first end of the fifth segment is coupled to the first port, and a second end of the fifth segment, the second segment and the first segment are coupled to the node, wherein the fifth segment has a preset impedance.

13. The dual-band transformer structure of claim 11, wherein each of an electrical length of the first segment, an electrical length of the second segment, an electrical length of the third segment, and an electrical length of the fourth segment is related to a first frequency and a second frequency, wherein the first frequency is different from the second frequency.

14. The dual-band transformer structure of claim 11, wherein the first transmission line further comprises a fifth segment, wherein a first end of the fifth segment is coupled to the second end of the second segment and the first end of the third segment, wherein the fifth segment has a preset impedance.

15. The dual-band transformer structure of claim 14, wherein a first circuit impedance formed by the third segment and the fifth segment is related to an impedance of the third segment, the preset impedance, and an electrical length of the third segment.

16. The dual-band transformer structure of claim 15, wherein a second circuit impedance formed by the second segment, the third segment, and the fifth segment is related to the first circuit impedance, an impedance of the second segment, and an electrical length of the second segment.

17. The dual-band transformer structure of claim 16, wherein a third circuit impedance formed by the first segment and the second segment is related to an impedance of the first segment, an electrical length of the first segment, and an impedance of the fourth segment.

18. The dual-band transformer structure of claim 17, wherein a fourth circuit impedance formed by the first segment, the second segment, the third segment, and the fourth segment is related to the second circuit impedance and the third circuit impedance, and the fourth circuit impedance is twice the preset impedance.

19. The dual-band transformer structure of claim 11, wherein an electrical length of the first segment is equal to an electrical length of the fourth segment.

20. The dual-band transformer structure of claim 19, wherein an impedance of the fourth segment is related to an impedance of the first segment and the electrical length of the first segment.

* * * * *